US006842084B2

(12) United States Patent
Herstein

(10) Patent No.: US 6,842,084 B2

(45) **Date of Patent: *Jan. 11, 2005**

(54) TRANSITION FROM A COAXIAL TRANSMISSION LINE TO A PRINTED CIRCUIT TRANSMISSION LINE

(76) Inventor: Dov Herstein, 25 Finland Street, Haifa 34989 (IL)

( * ) Notice: Subject to any disclaimer, the term of this patent is extended or adjusted under 35 U.S.C. 154(b) by 0 days.

This patent is subject to a terminal disclaimer.

(21) Appl. No.: 10/093,095

(22) Filed: Mar. 7, 2002

(65) Prior Publication Data

US 2003/0169124 A1 Sep. 11, 2003

(51) Int. Cl.$^{7}$ ............................ H03H 7/38; H01P 5/107

(52) U.S. Cl. ......................................... 333/33; 333/260

(58) Field of Search ............................. 333/26, 33, 34, 333/245, 260

(56) References Cited

U.S. PATENT DOCUMENTS

| | | | | | |
|---|---|---|---|---|---|
| 3,201,721 | A | | 8/1965 | Rudolph | 333/33 |
| 3,539,966 | A | | 11/1970 | Logan | 339/17 |
| 3,662,318 | A | * | 5/1972 | Decuyper | 439/63 |
| 3,783,321 | A | * | 1/1974 | Patterson | 361/772 |
| 4,494,083 | A | | 1/1985 | Josefsson et al. | 333/33 |
| 4,567,449 | A | | 1/1986 | Bert et al. | 331/56 |
| 4,595,890 | A | | 6/1986 | Cloutier | 333/106 |
| 4,656,441 | A | * | 4/1987 | Takahashi et al. | 333/33 |
| 4,754,241 | A | | 6/1988 | Spinner | 333/111 |
| 4,810,981 | A | | 3/1989 | Herstein | 333/27 |
| 4,975,065 | A | * | 12/1990 | Rosenberg et al. | 439/63 |
| 5,142,255 | A | * | 8/1992 | Chang et al. | 333/204 |
| 5,165,109 | A | | 11/1992 | Han et al. | 343/700 |
| 5,231,349 | A | | 7/1993 | Majidi-Ahy et al. | 324/158 |
| 5,404,117 | A | * | 4/1995 | Walz | 333/34 |
| 5,475,394 | A | | 12/1995 | Kohls et al. | 343/700 |
| 5,516,303 | A | | 5/1996 | Yohn et al. | 439/248 |
| 5,532,659 | A | * | 7/1996 | Dodart | 333/260 |
| 5,943,020 | A | | 8/1999 | Liebendoerfer et al. | 343/702 |

FOREIGN PATENT DOCUMENTS

| | | | |
|---|---|---|---|
| JP | 61 174801 | 8/1986 | H01P/5/08 |

OTHER PUBLICATIONS

Anrtisu, Components and Devices, catalog page –1992 prior art by Applicant's disclosure, KV1101, 1 page.*

Corning Gilbert, Inc. of Glendale Arizona, a Gilbert Puny Push on (GPPO), Catalog Ser. Nos.: B010–L and B009–P, May 2001.

Patent Abstract of Japan vol. 10, No. 384, Dec. 23, 1986 & JP 61 174801.

Anrtisu, Precision RF & Microwave Components Catalog 2001 p. 11.

* cited by examiner

*Primary Examiner*—Benny T. Lee
*Assistant Examiner*—Dean Takaoka
(74) *Attorney, Agent, or Firm*—Ladas & Parry

(57) ABSTRACT

A transition piece for coupling a coaxial transmission line to a printed circuit (PC) transmission line. The transmission line terminates in a conductive pin projecting through a conductive coaxial ground plane. The transition piece consists of a conductive plate which is adapted to be fixed between the coaxial ground plane and a PC ground plane of the PC transmission line. The plate is in electrical contact with both the coaxial and PC ground planes while the conductive pin contacts a conductive strip of the PC transmission line. Furthermore, the plate has an arcuate opening which is shaped and aligned with the pin so that a transition-impedance of the transition piece is substantially equal to a line impedance of the coaxial and PC transmission lines.

27 Claims, 4 Drawing Sheets

TRANSITION FROM A COAXIAL TRANSMISSION LINE TO A PRINTED CIRCUIT TRANSMISSION LINE

FIELD OF THE INVENTION

The present invention relates generally to couplings, and specifically to couplings between electronic transmission lines operating at high frequencies.

BACKGROUND OF THE INVENTION

Electronic transmission lines which are able to operate at frequencies of the order of 50 GHz require careful design in order to ensure efficient operation, specifically to reduce unwanted energy reflections and/or absorptions. Moreover, interconnecting these lines without careful design of the interconnections may lead to further similar inefficiencies of operation. Types of lines which are used to propagate these frequencies include coaxial and printed circuit (PC) transmission lines.

In the specification and in the claims, a PC transmission line is assumed to be any transmission line formed on a printed circuit board which is able to propagate frequencies in a range from DC (0 Hz) to approximately 50 GHz. Typically, a PC transmission line comprises a "signal" strip separated and insulated from at least one ground strip and/or ground plane. PC transmission lines are well known in the electronics art, and may be termed, inter alia, microstrip, stripline, stripguide, coplanar waveguide (CPW), grounded coplanar waveguide (GCPW), and/or WEN line(s).

Corning Gilbert Inc., of Glendale, Ariz., produce a Gilbert Puny Push On (GPPO) edge mount, catalog series number B010-L, and a GPPO right angle to printed circuit board coupling, catalog series number B009-P, both of which are designed to couple a PC transmission line to a coaxial transmission line. In both cases, the component is connected to the PC transmission line, and the combined component and transmission line may then be "pushed-on" to the coaxial transmission line so that the two lines are interconnected.

In many cases, a component having a coaxial transmission line output is adjusted to optimize performance of the component, and/or has measurements made on the component, before the component is ready for final use. Typically, a connector is attached to the output, enabling a standard coaxial connector to be coupled to the component's output. After the adjustments and/or measurements have been made, the connector is removed and the component is available for final use as a "drop-in" component.

U.S. Pat. No. 3,539,966, to Logan, whose disclosure is incorporated herein by reference, describes a PC transmission line to coaxial line connector which can be attached to a printed circuit board. A coaxial line adapter is soldered in place on the board, and an outer shell assembly is clamped over the adapter and is held in place by screws.

Couplings for connecting transmission lines operating at frequencies of 50 GHz and above need to pay particular attention to surface currents flowing on the grounds, in order to operate efficiently. In order to maintain a good ground regime, i.e., proper alignment of ground paths, differences between electrical properties (e.g., inductance and resistance differences) of incident and return currents must be minimized.

SUMMARY OF THE INVENTION

It is an object of some aspects of the present invention to provide a method and apparatus for coupling a coaxial output to a printed circuit transmission line.

In preferred embodiments of the present invention, a conductive plate acts as a transition between an output of a coaxial transmission line and a printed circuit (PC) transmission line, both lines having substantially the same impedance and being able to operate at frequencies from DC to approximately 50 GHz. The coaxial output comprises a pin and a conductive ground plane, which are typically part of a component conveying high frequency signals. There is a circular opening in the ground plane, and the pin penetrates the ground plane orthogonally via the opening, the pin being centered on the opening, thus forming an air-filled coaxial transmission line in the transition. Dimensions of the pin and the opening are implemented so as to generate a known impedance for the coaxial output, preferably substantially equal to 50 ohms.

The PC transmission line comprises a conductive linear "signal" strip, preferably having two conductive PC ground planes positioned with substantially equal spacing on either side of the strip, although other PC ground plane arrangements known in the art, such as use of a plane beneath the signal strip with/without plated vias, are possible. Dimensions of the signal strip, its spacing to the PC ground planes, and dielectric constants of insulating media comprised in the PC line, are implemented so that an impedance of the PC line is substantially equal to the impedance of the coaxial output.

The transition is preferably in the form of a generally rectangular plate. The plate preferably comprises two edge fingers between which is formed a semicircular arc, the arc center lying midway between the edge fingers. Alternatively, the two fingers are formed within the plate, rather than at an edge. The fingers of the transition are bent to form lugs substantially at right angles to the transition, for subsequent attachment to the printed circuit. After bending, a semicircular opening remains in the transition which has been foreshortened by the formation of the lugs. The transition is attached to the ground plane (of the component) so that the pin of the coaxial output is substantially coincident with the arc center, penetrating the semicircular opening. Most preferably, the transition is attached by screws to the component, via openings in the transition which align with tapped holes in the ground plane of the component. Alternatively, the transition is welded to the component by one of the welding methods known in the art, such as spot welding. The attached transition and component are herein termed a "drop-in" component.

The drop-in component is positioned with respect to the PC transmission line so that an edge of the line butts to the transition, the coaxial pin contacts the signal strip, and the lugs of the transition contact the ground planes of the PC transmission line. The pin and the signal strip are welded/soldered together, and the lugs and the ground planes are also welded/soldered together, by methods known in the art. When forming the transition, a diameter of the semicircular arc is set so that an impedance of the transition, after the transition has been mated with the ground plane, is substantially equal to the impedances of the coaxial output and the PC transmission line.

The transition thus couples the coaxial output and the PC transmission line efficiently, since the transition is designed to provide substantially the same impedance as the output and the line. The transition provides a good mating surface to the ground plane of the coaxial output, enabling the PC transmission line to be easily mechanically coupled to the coaxial output. Also, since the transition is formed from a single conductive sheet, it is significantly easier to implement than transitions known in the art. Moreover, the conductive plate provides a proper ground regime, coupling the ground plane of the coaxial transmission line to the ground planes of the printed circuit, and providing a good ground transition at frequencies of the order of 50 GHz.

In some preferred embodiments of the present invention, a "stress-relief contact" is coupled to the coaxial pin before the PC transmission line and the drop-in component are connected. The stress-relief contact comprises a split cylinder and a tab, the split cylinder slidingly mating with the coaxial pin. The PC transmission line is coupled to the drop-in component so that the tab contacts the central strip, the tab is welded/soldered to the central strip and the lugs are welded/soldered to the ground planes, substantially as described above. The diameter of the semicircular arc is most preferably adjusted to allow for the effective increased diameter of the coaxial pin due to the split cylinder, so as to maintain the impedance of the transition substantially equal to the impedances of the coaxial output and PC transmission line.

There is therefore provided, according to a preferred embodiment of the present invention, a transition piece for coupling a coaxial transmission line, which terminates in a conductive pin projecting through a conductive coaxial ground plane, to a printed circuit (PC) transmission line, the transition piece including:

a conductive plate, which is adapted to be fixed between the coaxial ground plane and a PC ground plane of the PC transmission line so that the plate is in electrical contact with both the coaxial and PC ground planes while the conductive pin contacts a conductive strip of the PC transmission line, the plate having an arcuate opening which is shaped and aligned with the pin so that a transition-impedance of the transition piece is substantially equal to a line impedance of the coaxial and PC transmission lines.

Preferably, the arcuate opening is formed in an edge of the conductive plate.

Further preferably, the edge includes fingers which are bent to form lugs, the lugs being adapted to be connected to the PC ground plane.

Preferably, the lugs are substantially orthogonal to a plane of the transition piece, and a printed circuit implementing the PC transmission line is substantially orthogonal to the coaxial ground plane.

Preferably, the lugs include two lugs which are disposed symmetrically about the arcuate opening.

Preferably, the transition piece includes a stress-relief contact consisting of a hollow cylinder coupled to a connecting tab, a wall of the hollow cylinder being split parallel to an axis of the cylinder, the stress-relief contact being aligned so that the hollow cylinder slidingly mates with the conductive pin and the connecting tab contacts the conductive strip.

Alternatively, the arcuate opening is formed within the conductive plate.

Preferably, the conductive plate includes fingers which are bent to form lugs, the lugs being adapted to be connected to the PC ground plane.

Preferably, the lugs are substantially orthogonal to a plane of the transition piece, and a printed circuit implementing the PC transmission line is substantially orthogonal to the coaxial ground plane.

Further preferably, the lugs consist of two lugs which are disposed symmetrically about the arcuate opening.

Preferably, the coaxial ground plane is implemented so as to protrude in a region close to the conductive pin.

Preferably, the conductive plate is implemented so as to protrude from a plane including the plate in a region close to the arcuate opening.

There is further provided, according to a preferred embodiment of the present invention, a method for coupling a coaxial transmission line, which terminates in a conductive pin projecting through a conductive coaxial ground plane, to a printed circuit (PC) transmission line, the method including:

providing a conductive plate;

removing material from the plate so as to form an arcuate opening in the plate; and connecting the plate between the coaxial ground plane and a PC ground plane of the PC transmission line so that the plate is in electrical contact with both the coaxial and PC ground planes while the conductive pin contacts a conductive strip of the PC transmission line and aligns with the arcuate opening so that a transition-impedance of the transition piece is substantially equal to a line impedance of the coaxial and PC transmission lines.

Preferably, the arcuate opening is formed in an edge of the conductive plate.

Preferably, removing the material includes forming fingers in the edge, and connecting the plate includes bending the fingers to form lugs and connecting the lugs to the PC ground plane.

Further preferably, bending the fingers to form the lugs includes forming the lugs to be substantially orthogonal to a plane of the plate, and connecting the lugs to the PC ground plane includes connecting a printed circuit which implements the PC transmission line to be substantially orthogonal to the coaxial ground plane.

Preferably, the lugs include two lugs which are disposed symmetrically about the arcuate opening.

The method preferably further includes:

providing a stress-relief contact including a hollow cylinder coupled to a connecting tab, a wall of the hollow cylinder being split parallel to an axis of the cylinder; and aligning the stress-relief contact so that the hollow cylinder slidingly mates with the conductive pin and the connecting tab contacts the conductive strip.

Alternatively, the arcuate opening is formed within the conductive plate.

Preferably, the conductive plate includes fingers which are bent to form lugs, the lugs being adapted to be connected to the PC ground plane.

Preferably, the lugs are substantially orthogonal to a plane of the transition piece, and a printed circuit implementing the PC transmission line is substantially orthogonal to the coaxial ground plane.

Preferably, the lugs consist of two lugs which are disposed symmetrically about the arcuate opening.

Preferably, the coaxial ground plane is implemented so as to protrude in a region close to the conductive pin.

Further preferably, providing the conductive plate includes forming a protrusion from a plane including the plate in a region of the plate close to the arcuate opening.

There is further provided, according to a preferred embodiment of the present invention, a transition piece for coupling a plurality of coaxial transmission lines, which terminate in respective conductive pins projecting through a conductive coaxial ground plane, to a plurality of printed circuit (PC) transmission lines, the transition piece including:

a conductive plate, which is adapted to be fixed between the coaxial ground plane and a PC ground plane of the plurality of PC transmission lines, so that the plate is in electrical contact with both the coaxial and PC ground planes while the respective conductive pins contact a respective plurality of conductive strips of the plurality of PC transmission lines, the plate having a plurality of arcuate openings each of which is shaped and aligned with the respective conductive pins so that a transition-impedance of each arcuate opening is substantially equal to a line impedance of the respective coaxial and PC transmission lines.

The present invention will be more fully understood from the following detailed description of the preferred embodiments thereof, taken together with the drawings, in which:

DETAILED DESCRIPTION OF PREFERRED EMBODIMENTS

Figure 1A:
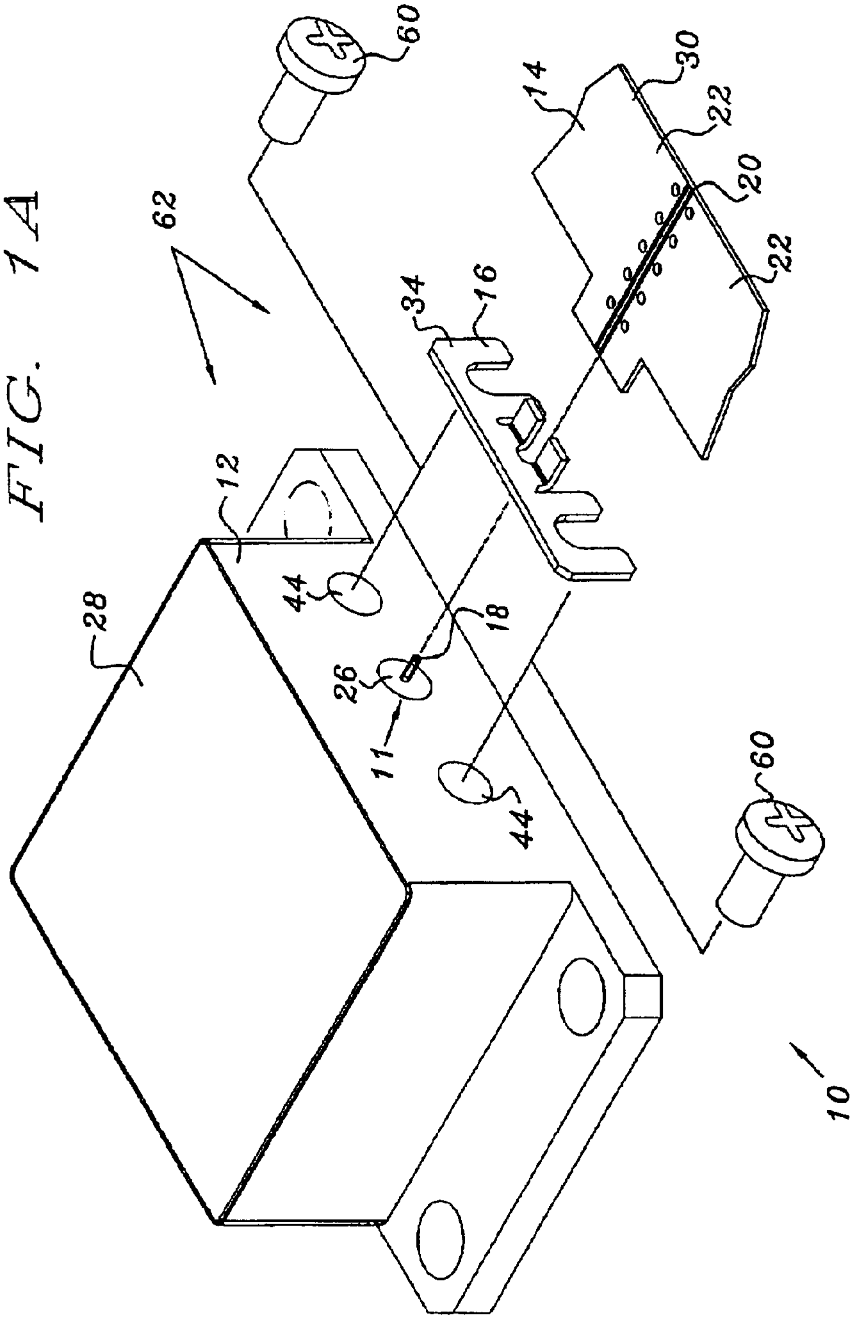
FIG. 1A is a schematic exploded diagram of transmission lines coupled in series, according to a preferred embodiment of the present invention.
Figure 1B:
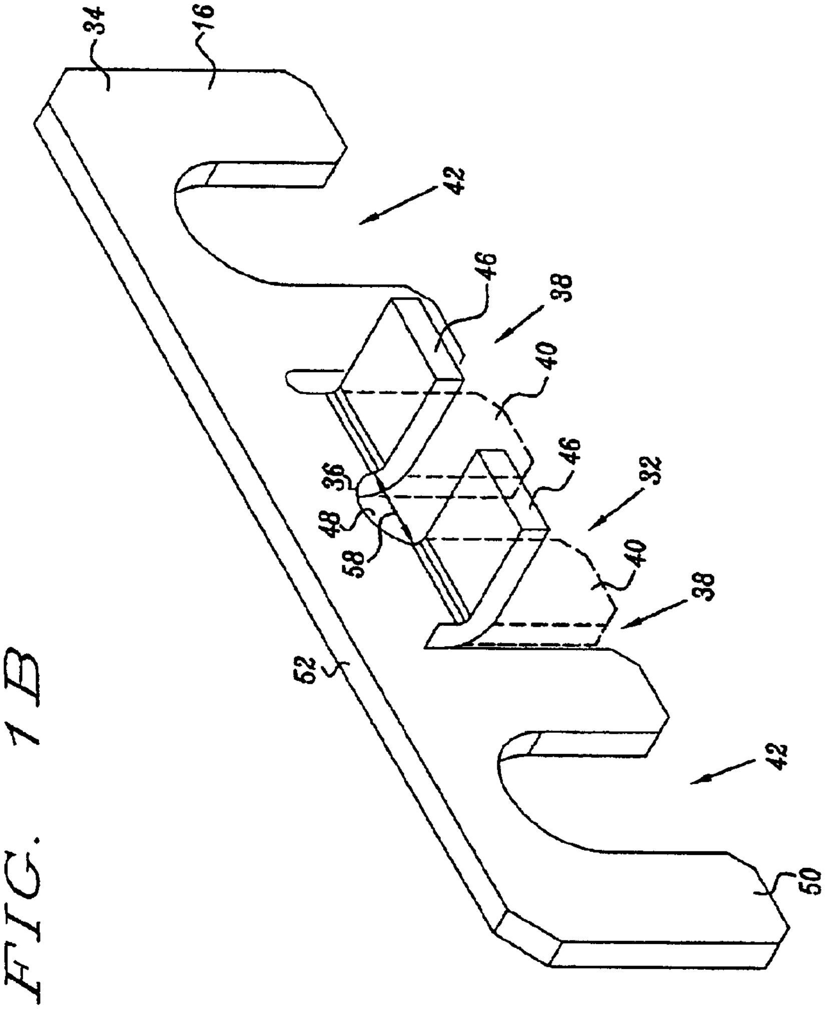
FIG. 1B is a schematic isometric diagram of a transition piece between the lines of FIG. 1A, according to a preferred embodiment of the present invention.

Reference is now made to FIG. 1A, which is a schematic exploded diagram of transmission lines 10 coupled in series, and to FIG. 1B, which is a schematic isometric diagram of a transition piece 16 between the lines, according to a preferred embodiment of the present invention. A coaxial transmission line terminates in an output 11 that consists of a conductive pin 18 which is centered on an opening 26 in a ground plane 12. Pin 18 protrudes substantially orthogonally from plane 12. Ground plane 12 is substantially flat, typically comprising an outer surface of a component 28 which is populated within the component by circuitry. It will be appreciated, however, that ground plane 12 may be formed from any other conductive plane. Preferably, the surface of ground plane 12 is plated with an inert good conductor such as gold. Component 28 and the circuitry within the component are implemented to operate at frequencies from 0 Hz (DC) to at least 50 GHz.

A diameter d of pin 18, and a diameter D of opening 26, are implemented so that an impedance of the output is a predetermined value such as 50106. In some preferred embodiments of the present invention, opening 26 is partially or completely filled by a dielectric material having an effective dielectric constant $\epsilon$. The impedance Z of the output is given by:

$$Z = \frac{138}{\sqrt{\varepsilon}} \ln \frac{D}{d} \tag{1}$$

Ground plane 12 also comprises tapped holes 44, which are used to couple transition 16 to the plane, as described hereinbelow.

Transition piece 16 is most preferably formed from a single sheet 34 of conducting material, and is generally rectangular in outline. For clarity in the following explanation, sheet 34 is assumed to be oriented with a wider side of the rectangle horizontal. It will be appreciated, however, that transition 16 may operate in substantially any orientation.

An "arch-like" cutout 32 is formed generally centrally and symmetrically in a lower edge 50 of sheet 34, the cutout forming an arcuate opening having substantially vertical sides terminated in a semicircular arc 36. The separation of the vertical sides is substantially equal to a diameter 58 of arc 36, so that the sides are generally tangential to the arc. Two cutouts 38 are formed substantially symmetrically on either side of cutout 32 in edge 50, so as to form fingers 40 in sheet 34. Fingers 40 are bent to form lugs 46 that are substantially orthogonal to sheet 34, leaving a semicircular opening 48 in a foreshortened edge of the sheet. As described further below, lugs 46 are generally aligned with a center of arc 36. Cutouts 42 are also formed substantially symmetrically on either side of cutout 32, at positions in sheet 34 so that positions of cutouts 42 are generally in line with holes 44 of ground plane 12. Most preferably, transition 16 is coupled to component 28 by screwing screws 60 into holes 44, so that pin 18 aligns with the center of arc 36, to form a "drop-in" component 62 comprising component 28 and the transition. Alternatively, transition 16 is coupled to component 28 by a welding process known in the art, such as spot welding.

In some preferred embodiments of the present invention, a region of transition 16 close to cutout 32 is implemented to slightly protrude towards component 18. Thus, when the transition and the component are attached a better galvanic contact between them forms in a region close to cutout 32 than if the transition does not protrude. The protrusion may be implemented by any method known in the art, such as preferential etching of a region of transition 16. Alternatively or additionally, ground plane 12 is implemented to slightly protrude in a region close to opening 26, so as to improve the galvanic contact when the transition and the component are attached.

PC transmission line 14 comprises a linear conductive strip 20 which has a generally constant cross-section along its length and which is formed on a surface of a printed circuit board 30. Preferably, strip 20 is centrally and symmetrically disposed with respect to a pair of ground planes 22, the ground planes being physically separated from the strip and being formed on the same surface of board 30. Alternatively, PC line 14 is implemented from linear conductive strip 20 and one or more ground planes 22 physically separated from the strip, by methods which are well known in the transmission line art. For example, ground planes 22 may comprise conductive planes on surfaces other than the surface of strip 20, and may also comprise plated vias between some of the planes. Dimensions of strip 20 and of separations between the strip and ground planes 22 are implemented so that an impedance of the PC transmission line is substantially equal to the impedance of output Drop-in component 62 is aligned with transmission line 14 by butting an edge of PC board 30 with a surface 52 of transition 16, by butting lugs 46 to ground planes 22, and so that an end of strip 20 contacts pin 18 and is substantially centered at a base of opening 48. Lugs 46 are formed so that a horizontal level of the lugs with respect to the center of arc 36 is set so that the above alignment occurs. It will be appreciated that one or more of lugs 46 may be at different horizontal levels, depending on how ground planes 22 are implemented. Lugs 46 are then mechanically and electrically coupled to ground planes 22, and pin 18 is similarly coupled to strip 20. In some preferred embodiments of the present invention, solder preforms are inserted between lugs 46 and planes 22, and/or between pin 18 and strip 20, and a process of parallel gap welding is used to heat the preforms so that they weld their respective contacting entities. Other methods for coupling lugs 46 to ground planes 22, and pin 18 to strip 20, will be familiar to those skilled in the art. Most preferably, lugs 46 maintain board 30 substantially orthogonal to surface 52 of the transition.

Diameter 58 of arc 36 is most preferably implemented so that an impedance of transition 16, when the transition is positioned to couple output 11 and PC transmission line 14 as described above, is substantially equal to the impedances of the output and of the line. Equation (1) may be used to estimate a first approximation for diameter 58, using the diameter of pin 18 as the value of d.

Figure 2:
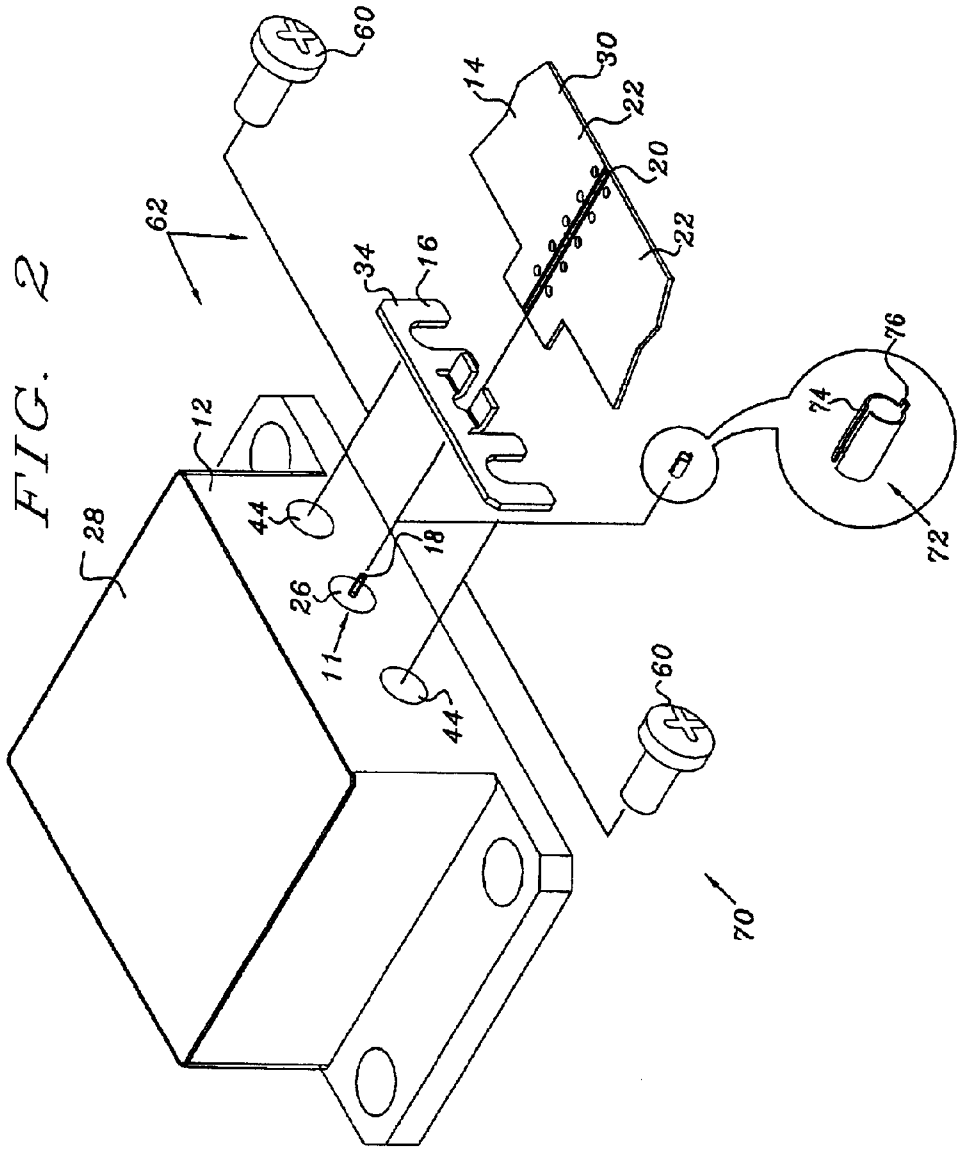
FIG. 2 is a schematic exploded diagram of transmission lines coupled in series, according to an alternative preferred embodiment of the present invention.

FIG. 2 is a schematic exploded diagram of coupled transmission lines 70, according to an alternative preferred embodiment of the present invention. Apart from the differences described below, the operation of lines 70 is generally similar to that of lines 10 (FIGS. 1A and 1B), so that elements indicated by the same reference numerals in coupled lines 70 and 10 are generally identical in construction and in operation. Before PC line 14 is coupled to drop-in component 62, a stress-relief contact 72 is attached to pin 18. Preferably, contact 72 is substantially similar to a stress-relief contact K110-1 or V110-1 produced by Anritsu Corporation of Richardson, Tex. Contact 72 comprises a hollow cylinder 74 having a tab 76 protruding from an end of the cylinder. The wall of cylinder 74 is split parallel to the axis of the cylinder. The cylinder is formed to have an internal diameter of a dimension allowing it to be slidingly mated with pin 18, effectively increasing the diameter of the pin to be the external diameter of cylinder 74. Most preferably, diameter 58 of arc 36 is implemented to take account of the effective increased diameter of pin 18.

After contact 72 has been slid onto pin 18, tab 76 is soldered/welded to strip 20, and lugs 46 are soldered/welded to ground planes 22, substantially as described above for lines 10.

Figure 3:
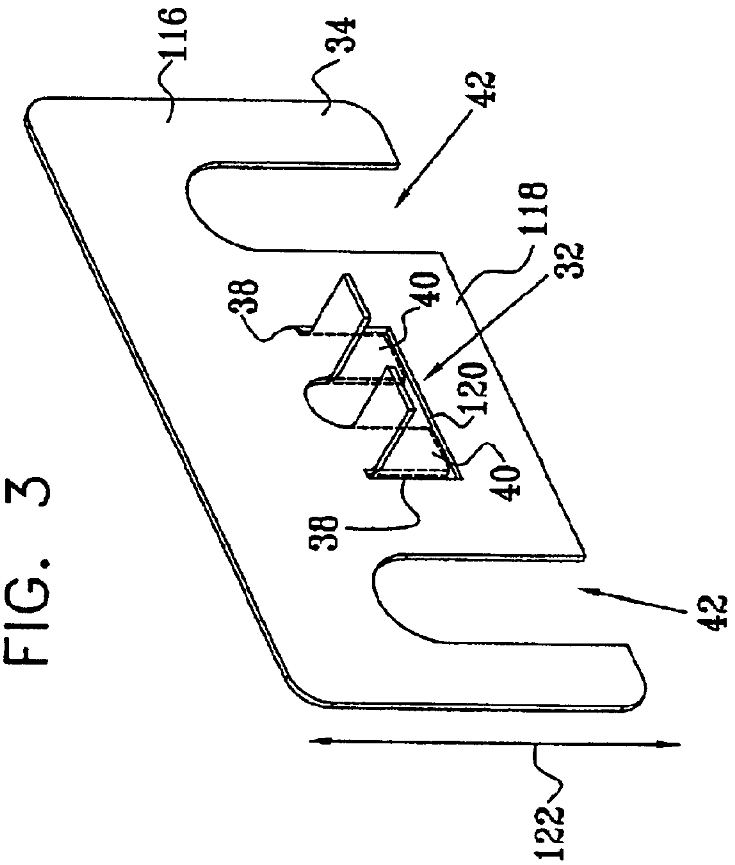
FIG. 3 is a schematic isometric diagram of an alternative transition piece, according to a preferred embodiment of the present invention.

FIG. 3 is a schematic isometric diagram of an alternative transition piece 116, according to a preferred embodiment of the present invention. Apart from the differences described below, implementation and operation of transition piece 116 is generally similar to that of transition piece 16 (FIG. 1B), so that elements indicated by the same reference numerals in transition pieces 16 and 116 are generally similar in construction and in operation. In contrast to transition 16, arch-like cutout 32 of transition piece 116 is formed as an arcuate opening within single sheet 34, so that the cutout is bounded on its lower edge by a section 118 of piece 116. Fingers 40, on either side of cutout 32, are formed by cutouts 38 and an upper edge 120 of part 118, and the fingers are bent to form lugs 46. It will be appreciated that, due to section 118, a vertical height 122 of transition piece 116 is greater than a vertical height of piece 16, and that cutouts 42 for piece 116 are correspondingly deeper than those of piece 16.

It will be understood that while the preferred embodiments described above comprise a transition which couples one coaxial transmission line to one PC transmission line, the scope of the present invention comprises coupling a plurality of coaxial transmission lines with a respective plurality of PC transmission lines. For example, a transition generally similar to transition 16 or transition 116, but having two arcuate openings, may be used to couple a differential coaxial transmission line, comprising two coaxial transmission lines, with a differential PC transmission line, comprising two PC transmission lines.

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A transition piece for coupling a coaxial transmission line, which terminates in a conductive pin projecting through a conductive coaxial ground plane, to a printed circuit (PC) transmission line, the transition piece comprising:

a conductive plate, which is adapted to be fixed between the coaxial ground plane and a PC ground plane of the PC transmission line so that the plate is in electrical contact with both the coaxial and PC ground planes while the conductive pin contacts a conductive strip of the PC transmission line, the plate having an arch-like opening which is shaped and aligned substantially orthogonally with the pin so that a transition-impedance of the transition piece is substantially equal to a line impedance of the coaxial and PC transmission lines.

2. A transition piece according to claim 1, wherein the arch-like opening is formed in an outer edge of the conductive plate.

3. A transition piece according to claim 2, wherein the edge comprises fingers which are bent to form lugs, the lugs being adapted to be connected to the PC ground plane.

4. A transition piece according to claim 3, wherein the conductive plate comprises a substantially single plane and wherein the lugs are substantially orthogonal to the substantially single plane.

5. A transition piece according to claim 3, wherein the lugs comprise two lugs which are disposed symmetrically about the arch-like opening.

6. A transition piece according to claim 1, and comprising a stress-relief contact comprising a hollow cylinder coupled to a connecting tab, a wall of the hollow cylinder being split parallel to an axis of the cylinder, the stress-relief contact being aligned so that the hollow cylinder slidingly mates with the conductive pin and the connecting tab contacts the conductive strip.

7. A transition piece according to claim 1, wherein the arch-like opening is formed within a single plane of the conductive plate.

8. A transition piece according to claim 7, wherein the conductive plate comprises fingers which are bent to form lugs, the lugs being adapted to be connected to the PC ground plane.

9. A transition piece according to claim 8, wherein the conductive plate comprises a substantially single plane and wherein the lugs are substantially orthogonal to the substantially single plane.

10. A transition piece according to claim 8, wherein the lugs comprise two lugs which are disposed symmetrically about the arch-like opening.

11. A transition piece according to claim 1, wherein the arch-like opening is shaped to form a substantially semicircular opening.

12. A transition piece according to claim 1, wherein the conductive plate is implemented so as to protrude from a plane comprising the plate in a region close to the arch-like opening.

13. A method for coupling a coaxial transmission line, which terminates in a conductive pin projecting through a conductive coaxial ground plane, to a printed circuit (PC) transmission line, the method comprising:

providing a conductive plate;

removing material from the plate so as to form an arch-like opening in the plate; and connecting the plate between the coaxial ground plane and a PC ground plane of the PC transmission line so that the plate is in electrical contact with both the coaxial and PC ground planes while the conductive pin contacts a conductive strip of the PC transmission line and aligns substantially orthogonally with the arch-like opening so that a transition-impedance of the plate is substantially equal to a line impedance of the coaxial and PC transmission lines.

14. A method according to claim 13, wherein the arch-like opening is formed in an outer edge of the conductive plate.

15. A method according to claim 13, and comprising:

providing a stress-relief contact comprising a hollow cylinder coupled to a connecting tab, a wall of the hollow cylinder being split parallel to an axis of the cylinder; and aligning the stress-relief contact so that the hollow cylinder slidingly mates with the conductive pin and the connecting tab contacts the conductive strip.

16. A method according to claim 13, wherein the arch-like opening is formed within a single plane of the conductive plate.

17. A method according to claim 16, wherein the conductive plate comprises fingers which are bent to form lugs, the lugs being adapted to be connected to the PC ground plane.

18. A method according to claim 17, wherein the lugs are substantially orthogonal to a plane of the transition piece, and wherein a printed circuit implementing the PC transmission line is substantially orthogonal to the coaxial ground plane.

19. A method according to claim 17, wherein the lugs comprise two lugs which are disposed symmetrically about the arch-like opening.

20. A method according to claim 13, wherein providing the conductive plate comprises forming a protrusion from a plane comprising the plate in a region of the plate close to the arch-like opening.

21. A method according to claim 13, and comprising shaping the arch-like opening to form a substantially semicircular opening, and wherein connecting the plate comprises aligning the conductive pin with the substantially semicircular opening.

22. A method for coupling a coaxial transmission line, which terminates in a conductive pin projecting through a conductive coaxial around plane, to a printed circuit (PC) transmission line, the method comprising:

providing a conductive plate;

removing material from the plate so as to form an arcuate opening in the plate; and connecting the plate between the coaxial ground plane and a PC around plane of the PC transmission line so that the plate is in electrical contact with both the coaxial and PC around planes while the conductive pin contacts a conductive strip of the PC transmission line and aligns with the arcuate opening so that a transition-impedance of the plate is substantially equal to a line impedance of the coaxial and PC transmission lines, wherein the arcuate opening is formed in an edge of the conductive plate, and wherein removing the material comprises forming fingers in the edge, and wherein connecting the plate comprises bending the fingers to form lugs and connecting the lugs to the PC ground plane.

23. A method according to claim 22, wherein bending the fingers to form the lugs comprises forming the lugs to be substantially orthogonal to a plane of the plate, and wherein connecting the lugs to the PC ground plane comprises connecting a printed circuit which implements the PC transmission line to be substantially orthogonal to the coaxial ground plane.

24. A method according to claim 22, wherein the lugs comprise two lugs which are disposed symmetrically about the arcuate opening.

25. A transition piece for coupling a plurality of coaxial transmission lines, which terminate in respective conductive pins projecting through a conductive coaxial ground plane, to a plurality of printed circuit (PC) transmission lines, the transition piece comprising:

a conductive plate, which is adapted to be fixed between the coaxial ground plane and a PC ground plane of the plurality of PC transmission lines, so that the plate is in electrical contact with both the coaxial and PC ground planes while the respective conductive pins contact a respective plurality of conductive strips of the plurality of PC transmission lines, the plate having a plurality of arch-like openings each of which is shaped and aligned substantially orthogonally with the respective conductive pins so that a transition-impedance of each arch-like opening is substantially equal to a line impedance of the respective coaxial and PC transmission lines.

26. A transition piece for coupling a coaxial transmission line, which terminates in a conductive pin projecting through a conductive coaxial ground plane, to a printed circuit (PC) transmission line, the coaxial ground plane having a protrusion in a region close to the conductive pin, the transition piece comprising:

a conductive plate, which is adapted to be fixed between the coaxial ground plane and a PC ground plane of the PC transmission line so that the plate is in electrical contact with the coaxial and PC ground planes and the protrusion while the conductive pin contacts a conductive strip of the PC transmission line, the plate having an arcuate opening which is shaped and aligned with the pin so that a transition-impedance of the transition piece is substantially equal to a line impedance of the coaxial and PC transmission lines.

27. A method for coupling a coaxial transmission line, which terminates in a conductive pin projecting through a conductive coaxial ground plane, to a printed circuit (PC) transmission line, the method comprising:

forming a protrusion on the coaxial ground plane in a region of the conductive pin;

providing a conductive plate;

removing material from the plate so as to form an arcuate opening in the plate; and connecting the plate between the coaxial ground plane and a PC ground plane of the PC transmission line so that the plate is in electrical contact with the coaxial and PC ground planes and the protrusion while the conductive pin contacts a conductive strip of the PC transmission line and aligns with the arcuate opening so that a transition-impedance of the plate is substantially equal to a line impedance of the coaxial and PC transmission lines.

* * * * *